(12) United States Patent
Kurogi

(10) Patent No.: US 7,322,239 B2
(45) Date of Patent: Jan. 29, 2008

(54) SEMICONDUCTOR DEVICE AND MANUFACTURING METHOD THEREOF

(75) Inventor: Takashi Kurogi, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 185 days.

(21) Appl. No.: 11/294,491

(22) Filed: Dec. 6, 2005

(65) Prior Publication Data

US 2006/0130582 A1 Jun. 22, 2006

(30) Foreign Application Priority Data

Dec. 21, 2004 (JP) ............... 2004-369876

(51) Int. Cl.
*G01P 15/08* (2006.01)
*H01L 25/04* (2006.01)

(52) U.S. Cl. ............... 73/514.01; 73/514.38; 73/514.33; 257/686

(58) Field of Classification Search ......... 73/514.01, 73/514.16, 514.33, 514.36, 514.38; 257/686
See application file for complete search history.

(56) References Cited

U.S. PATENT DOCUMENTS 6,627,983 B2 * 9/2003 Tu et al. ............... 257/680
2002/0175401 A1 * 11/2002 Huang et al. ............... 257/686
2003/0038374 A1 * 2/2003 Shim et al. ............... 257/777
2005/0194673 A1 * 9/2005 Kwon et al. ............... 257/686

FOREIGN PATENT DOCUMENTS

JP 06-242141 9/1994

* cited by examiner

*Primary Examiner*—John E. Chapman
(74) *Attorney, Agent, or Firm*—Rabin & Berdo, PC

(57) ABSTRACT

A semiconductor device includes a lead frame. The lead frame has a chip mounting section and a plurality of leads. The chip mounting section has a base section, an insulation film covering the base section, a plurality of inter-connect sections, and a chip mounting area. The leads surround the chip mounting section. The semiconductor device also includes a first semiconductor chip having a plurality of first electrode pads. The semiconductor device also includes first bonding wires for connecting the first electrode pads to the inter-connect sections. The semiconductor device also includes a second semiconductor chip which has a cavity and a plurality of second electrode pads. The first semiconductor chip and the first bonding wires are received in the cavity. Second bonding wires connect the inter-connect sections exposed from the second semiconductor chip to the leads. Third bonding wires connect the second electrode pads to the leads. The semiconductor device also includes a sealing section.

20 Claims, 7 Drawing Sheets

SEMICONDUCTOR DEVICE AND MANUFACTURING METHOD THEREOF

BACKGROUND OF THE INVENTION

1. Field of the Invention

The present invention relates to a semiconductor device and the manufacturing method thereof, and more particularly to a resin-sealed-type semiconductor device in which a semiconductor chip, having a moving section, is packaged, and the manufacturing method of such semiconductor device.

2. Description of the Related Art

A technology for manufacturing a several hundred μm level micro-structure using micro-machining technology, which relies upon semiconductor micro-processing technology, is developing. For example, such technology is already applied to various sensors, to optical switches in the optical communications field and to radio frequency (RF) components.

A certain micro structure having a moving section can be manufactured by a conventional semiconductor manufacturing process so that such micro-structure can be integrated on a single chip along with transistors.

A chip on which a system with specific functions, including the micro-moving structure having a moving section, is called a Micro-Electrical-Mechanical-System (MEMS) chip, or a Micro-System Technology (MIST) chip. Such chip is hereafter simply called an MEMS chip in this specification. One example of the MEMS chip is an acceleration sensor chip. The MEMS chip is packaged into a device that includes a control chip for controlling the MEMS chip.

A conventional semiconductor acceleration sensor (package) which prevents the breakdown of an acceleration sensor chip (i.e., MEMS device) even if excessive acceleration is received is disclosed in Japanese Patent Application Kokai (Laid-Open) No. 6-242141. This conventional semiconductor acceleration sensor can have a good manufacturing yield.

The semiconductor acceleration sensor disclosed in Japanese Patent Application Kokai No. 6-242141 includes an acceleration sensor chip, an IC chip mounted on the top face of the acceleration sensor chip, and a substrate on which these chips are mounted.

The IC chip is mounted such that the cavity covers and protects the moving section of the acceleration sensor chip. A processing circuit for processing the output signal of the acceleration sensor chip is formed on the IC chip, and the cavity is formed in the back face of the IC chip. The substrate on which the IC chip and acceleration sensor chip are mounted is contained in an air-tight space formed by a base and a box-shaped cap.

In this conventional acceleration sensor chip package, the IC chip is layered on the acceleration sensor chip. The IC chip and acceleration sensor chip are contained in the air-tight space defined by the base and the box-shaped cap.

The moving section has a weight section and the beam section which supports the weight section. Recently the sizes of acceleration sensor chips are decreasing. So implementing both downsizing and an improvement of sensitivity is demanded, but the downsizing of the moving section has limitations. Therefore the downsizing of an acceleration sensor chip depends on downsizing the frame enclosing this moving section.

The conventional acceleration sensor chip package has the IC chip on the acceleration sensor chip. As the size of the frame section of acceleration sensor chips decreases, it is becoming difficult to layer the IC chip on the acceleration sensor chip, without damaging the functions of the acceleration sensor chip.

Also in the conventional configuration, resin sealing cannot be used. Thus, the acceleration sensor chip is sealed using a cap, which makes the entire package bulky.

The package having the layered chips together with the cap requires a precise alignment of the chips. This makes manufacturing steps complicated, and decreases the mass producability of the package, which in turn increases manufacturing cost.

Accordingly, a technology to further decrease the size and manufacturing cost of a semiconductor device (e.g., acceleration sensor chip package) is demanded.

SUMMARY OF THE INVENTION

According to a first aspect of the present invention, there is provided a semiconductor device that includes a lead frame. The lead frame has a chip mounting section and a plurality of leads. The chip mounting section has a base section, an insulation film covering the face of the base section, and a plurality of inter-connect sections arrayed on the insulation film along edges of the base section. The chip mounting section also has a chip mounting area disposed inside the array of the inter-connect sections. The leads are spaced from the chip mounting section and surround the chip mounting section.

This semiconductor device also includes a first semiconductor chip having a plurality of first electrode pads mounted on the chip mounting area.

This semiconductor device also includes first bonding wires for electrically connecting the first electrode pads to the inter-connect sections.

This semiconductor device also includes a second semiconductor chip having a first main surface and an opposite, second main surface. The second semiconductor chip is mounted on the chip mounting section, with a part of the inter-connect sections exposed. The second semiconductor chip also has a cavity formed from the second main surface into the body of the second semiconductor chip, and a plurality of second electrode pads. The second electrode pads are exposed from the first main surface and are formed along edges of the first main surface. The first semiconductor chip and the first bonding wires are received in the cavity.

This semiconductor device further includes second bonding wires for electrically connecting the exposed part of the inter-connect sections to the leads.

This semiconductor device further includes third bonding wires for electrically connecting the second electrode pads to the leads.

This semiconductor device further includes a sealing section for sealing the second and third bonding wires, the second semiconductor chip and the leads such that a part of the leads is left as an exposed section. The exposed section of the leads are used as external terminals.

The cavity is created in the second semiconductor chip of this semiconductor device, and the first semiconductor chip, such as an acceleration sensor chip, is received in the cavity air-tightly. Thus, resin sealing is possible.

If an acceleration sensor chip is used as the first semiconductor chip, the control chip (i.e., second semiconductor chip) and the acceleration sensor chip to be controlled by this control chip can be integrated into a single package, even if the frame of the semiconductor device is downsized.

Therefore further downsizing of the package can be achieved while improving the functions and adding more values.

According to a second aspect of the present invention, there is provided a manufacturing method for a semiconductor device. This manufacturing method includes the following steps.

First a lead frame is prepared. The lead frame includes a chip mounting section and a plurality of leads. The chip mounting section has a base section, an insulation film covering the surface of the base section, and a plurality of inter-connect sections arrayed on the insulation film along the edges of the base section. The chip mounting section also has a chip mounting area disposed inside the array of inter-connect sections. The leads are spaced from the chip mounting section and surround the chip mounting section.

Then, a first semiconductor chip having a plurality of first electrode pads is mounted on the chip mounting area.

The first electrode pads are electrically connected to the inter-connect sections using the first bonding wires.

Subsequently, a second semiconductor chip having a first main surface and a second, opposite main surface is prepared. The second semiconductor chip is mounted on the chip mounting section. The second semiconductor chip also has a cavity formed from the second main surface into the body of the second semiconductor chip. The second semiconductor chip also has a plurality of second electrode pads, which are exposed from the first main surface and which are formed along the edges of the first main surface.

The second semiconductor chip is mounted on the chip mounting section such that the first semiconductor chip and the first bonding wires are received in the cavity and a part of the inter-connect sections is exposed.

The inter-connect sections exposed from the second semiconductor chip are electrically connected to the leads using the second bonding wires.

The second electrode pads are electrically connected to the leads using the third bonding wires.

Then, a sealing section for sealing the second and third bonding wires, the second semiconductor chip and the leads is formed such that a part of the leads is left as an exposed section.

The exposed section of the leads and the support leads are cut so as to obtain separate semiconductor devices.

This semiconductor device manufacturing method uses the lead frame so that a semiconductor device having the above mentioned configuration can be efficiently manufactured using simple steps. Therefore the manufacturing cost can be further decreased.

DETAILED DESCRIPTION OF THE INVENTION

Embodiments of the present invention will now be described with reference to the drawings. The drawings show the shape, size and positional relationship of each element to simply help the understanding of this invention, and the present invention is not particularly restricted by the illustrated elements. In the following description, specific materials, conditions and numerals may be used, but these are merely preferred embodiments, and therefore the present invention is not restricted thereby in any way. The same element is denoted by the same reference/symbol in different drawings.

Semiconductor Device

A configuration example of the semiconductor device 10 of this embodiment will be described with reference to FIGS. 1A, 1B, 1C and 2A.

Figure 1A:
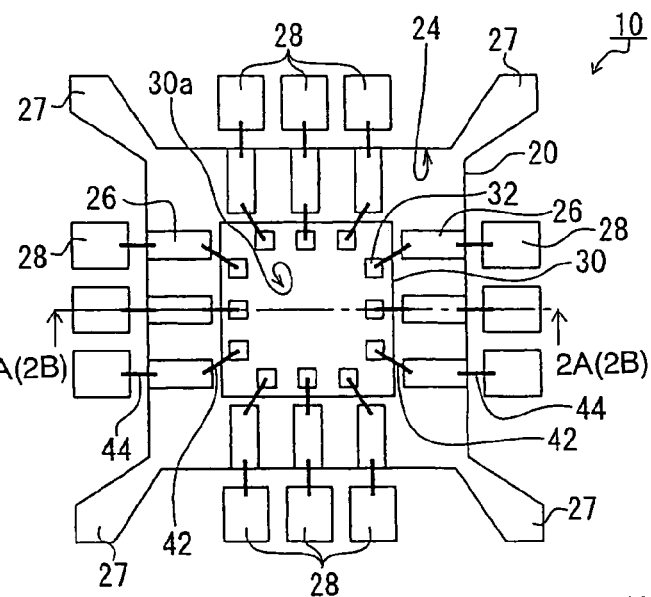
FIG. 1A is a plan view depicting elements of a semiconductor device according to a first embodiment of the present invention, without a sealing section and a second semiconductor chip.
Figure 1B:
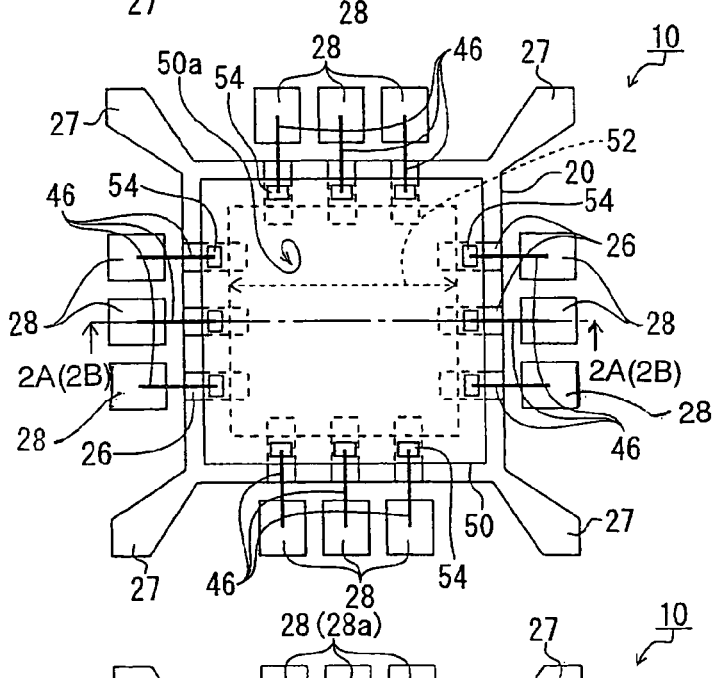
FIG. 1B is similar to FIG. 1A and illustrates a plan view of the semiconductor device according to the first embodiment, without the sealing section.
Figure 1C:
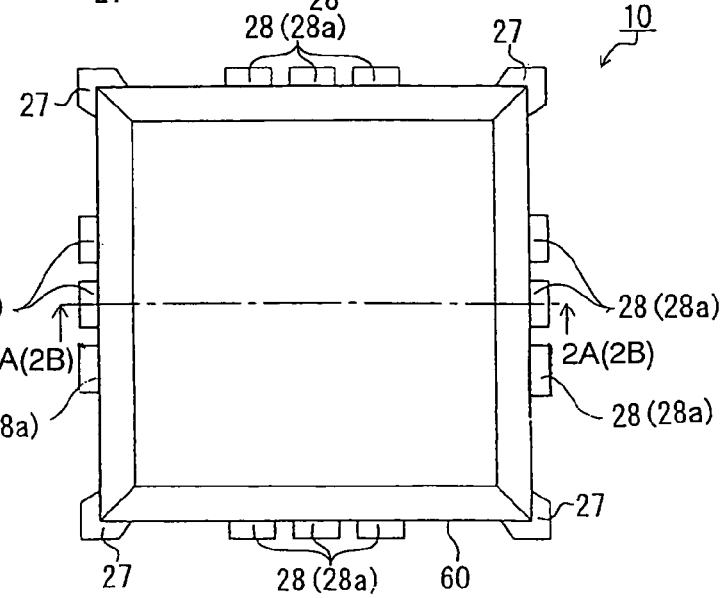
FIG. 1C is similar to FIG. 1A and illustrates a plan view of the semiconductor device according to the first embodiment.

FIG. 1A is a plan view depicting the elements of the semiconductor device 10. For the sake of easier understanding, the sealing section (described later) positioned on the outermost surface and the second semiconductor chip positioned under the sealing section are not illustrated. FIG. 1B is also a plan view depicting the elements of the semiconductor device 10. For the sake of illustration, the sealing section positioned at the outermost surface is omitted. FIG. 1C is also a plan view of the semiconductor device 10.

Figure 2A:
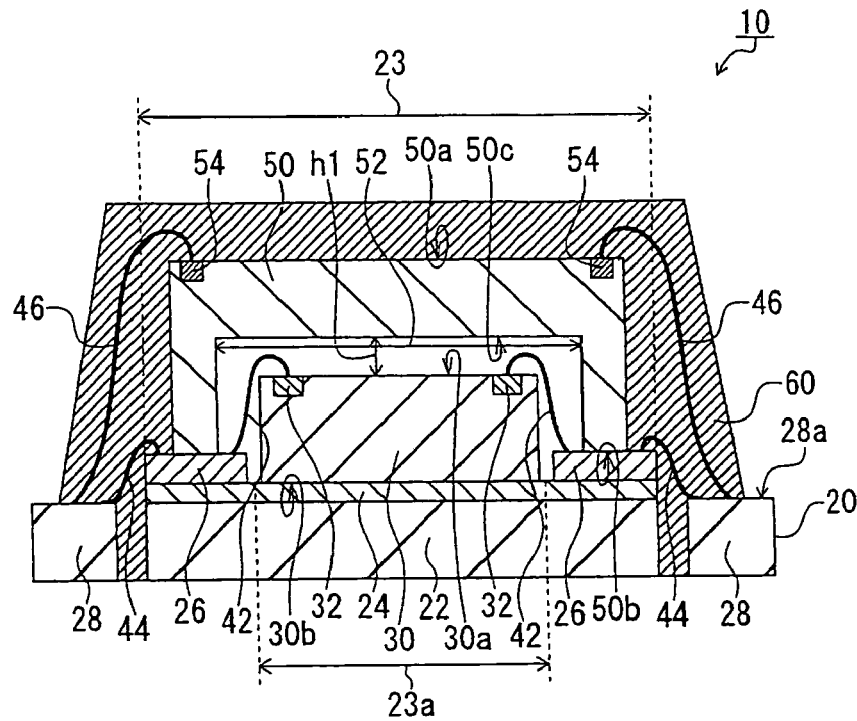
FIG. 2A is a cross-sectional view taken along the dashed line 2A-2A in FIGS. 1A, 1B and 1C.

FIG. 2A is a diagram depicting the cross-section cut at the dashed line 2A-2A in FIGS. 1A, 1B and 1C.

As FIGS. 1A, 1B, 1C and 2A show, the semiconductor device 10 includes a chip mounting section 23 which is a part of the lead frame 20 (described later). The chip mounting section 23 includes a base section 22 which is an essential part of the lead frame 20. The base section 22 is made of conductive metal, such as copper, iron or an alloy thereof, which constitutes the lead frame 20. The base section 22 in the illustrated embodiment is square.

The chip mounting section 23 includes an insulation film 24 which covers the surface of the base section 22. It is preferable that the insulation film 24 is a common insulation film, such as polyimide, made by an appropriate deposition method.

A plurality of inter-connect sections 26 are disposed on the insulation film 24. The inter-connect sections 26 are arrayed along the four edges of the base section 22. Each inter-connect section 26 has a short strip shape and extends in the vertical direction to the associated edge of the square base section 22. In this embodiment, three inter-connect sections 26 are disposed in each edge. The inter-connect sections 26 can be formed by a common inter-connect formation process, using common conductive materials such as copper and aluminum.

The area inside the array of the inter-connect sections 26 is called the "chip mounting area 23a".

From each of the four corners of the square chip mounting section 23, the support lead 27 protrudes diagonally in a direction equally dividing the corner. These support leads 27 are a part of the lead frame 20.

A plurality of leads 28 surround the chip mounting section 23, but are spaced from the chip mounting section 23. In this embodiment, three leads 28 are disposed for each edge of the chip mounting section 23. Each lead 28 has a short strip shape and extends in a perpendicular direction to the edge of the chip mounting section 23. These leads 28 are also a part of the lead frame 20.

The first semiconductor chip 30 is mounted on the chip mounting area 23a of the chip mounting section 23. The first semiconductor chip 30 has a rectangular parallelepiped shape having an upper surface 30a and a lower surface 30b. The upper surface 30a is parallel to the lower surface 30b. The first semiconductor chip 30 is mounted inside the inter-connect sections 26 on the insulation film 24 (i.e., the chip mounting area 23a) such that the first semiconductor chip 30 does not contact the inter-connect sections 26. The first semiconductor chip 30 is mounted by bonding the lower surface 30b with a common die bonding material.

The first semiconductor chip 30 has a plurality of first electrode pads 32 on the upper surface 30a. Three first electrode pads 32 are provided for each edge of the upper surface 30a. The first electrode pads 32 are electrode pads for accepting signals from the outside into the first semiconductor chip 30 or supplying the output signals of the first semiconductor chip 30 to the outside.

Preferably, the first semiconductor chip 30 is an MEMS chip. Examples of an MEMS chip are sensors, optical switches in the optical communications field, and radio frequency (RF) components. The semiconductor device of this embodiment is particularly suitable when an acceleration sensor chip is the MEMS chip.

An acceleration sensor chip is a semiconductor chip that can measure acceleration.

The semiconductor device 10 includes the first bonding wires 42. The first bonding wires 42 electrically connect the first electrode pads 32 of the first semiconductor chip 30 to the inter-connect sections 26 of the chip mounting section 23 in a one-to-one correspondence in this embodiment. The first bonding wires 42 can be disposed using a common bonding device with an ordinary fine metal wire.

The semiconductor device 10 also includes the second semiconductor chip 50. The second semiconductor chip 50 has a rectangular parallelepiped shape having a first main surface 50a and a second main surface 50b. The first main surface 50a is parallel to the second main surface 50b. The second semiconductor chip 50 has a cavity 52 in the second main surface 50b. The cavity 52 has a bottom face 50c.

The second semiconductor chip 50 has a plurality of second electrode pads 54. The second electrode pads 54 are exposed from the first main surface 50a, and are arrayed along the four edges of the first main surface 50a. In this embodiment, three second electrode pads 54 are disposed for each of the four edges of the first main surface 50a.

The second semiconductor chip 50 is mounted on the chip mounting section 23 such that the first semiconductor chip 30 and the first bonding wires 42 are located inside the cavity 52 of the second semiconductor chip 50. In other words, the second semiconductor chip 50 is mounted on the chip mounting section 23 and spans the inter-connect sections 26.

Specifically a part of the area of the inter-connect sections 26, to which the first bonding wires 42 are connected, is received in the cavity 52, and the remaining area thereof is exposed to the outside from the second semiconductor chip 50. The second main surface 50b is bonded to the chip mounting section 23.

The second semiconductor chip 50 is preferably a control chip which controls the operation of the MEMS chip (i.e., first semiconductor chip 30), and executes appropriate processing based on the signals exchanged between the MEMS chip and the second semiconductor chip 50.

The bottom face 50c of the cavity 52 is spaced from the upper surface 30a of the first semiconductor chip 30 by a distance h1, with which the operation of the first semiconductor chip 30 is not affected.

The control chip is a semiconductor chip which performs electrical operations for controlling the operation of the MEMS chip. The control chip performs one or more desired functions selected from the amplifier function, angle calibration function, A/D conversion function, D/A conversion function, memory function and other functions.

The semiconductor device 10 has second bonding wires 44. The second bonding wires 44 electrically connect the inter-connect sections 26 of the chip mounting section 23, exposed from the second semiconductor chip 50 mounted on the chip mounting section 23, to the leads 28 in a one-to-one correspondence in this embodiment.

The semiconductor device 10 has third bonding wires 46. The third bonding wires 46 electrically connect the second electrode pads 54 of the second semiconductor chip 50 to the leads 28 of the chip mounting section 23 in a one-to-one correspondence in this embodiment.

The semiconductor device 10 has a sealing section 60. The sealing section 60 seals the second and third bonding wires 44 and 46 and the second semiconductor chip 50. The sealing section 60 exposes a part (28a) of the leads 28. As a result, the exposed part 28a of the leads 28 becomes the external terminals connected to the substrate on which the semiconductor device 10 is mounted.

Standard sizes of the first semiconductor chip 30 and the second semiconductor chip 50 are, for example, as follows. The first semiconductor chip 30 is a 3 mm×3 mm square chip with a 500 µm height. The second semiconductor chip 50 is a 6 mm×6 mm square chip with a 650 µm height. The depth of the cavity 52 of the second semiconductor chip 50 is 550 µm.

Acceleration Sensor Chip

Now a configuration of an acceleration sensor chip in the semiconductor device 10, which can be used as the first semiconductor chip, will be described with reference to FIGS. 3A and 3B.

Here a piezo type acceleration sensor chip having a piezo resistance element will be described as an example. It should be noted that the configuration of this acceleration sensor chip is an example, and common acceleration sensor chips having various other configurations can be applied to the semiconductor device of this invention. Therefore a specific configuration of the acceleration sensor chip, which is not the subject of this invention, will be described only in general.

Figure 3A:
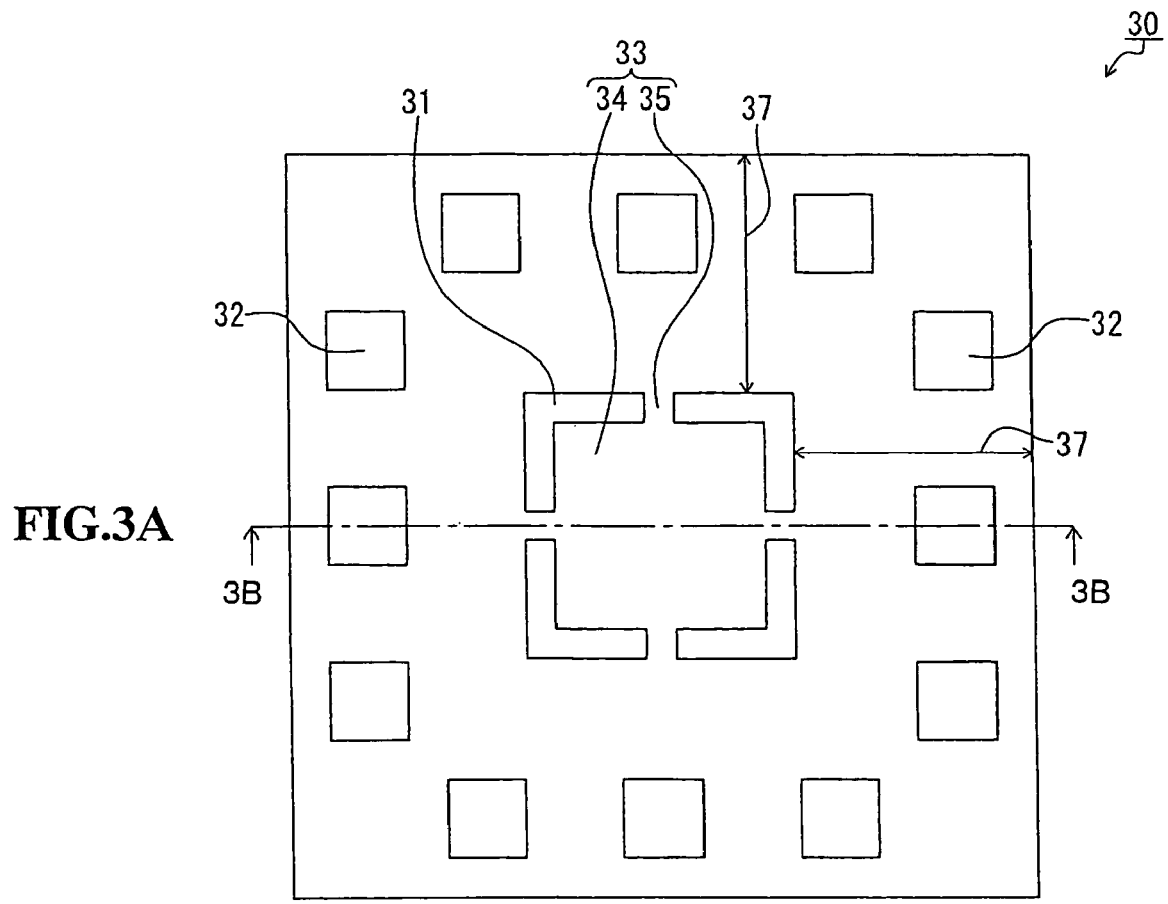
FIG. 3A is a plan view of an acceleration sensor chip.
Figure 3B:
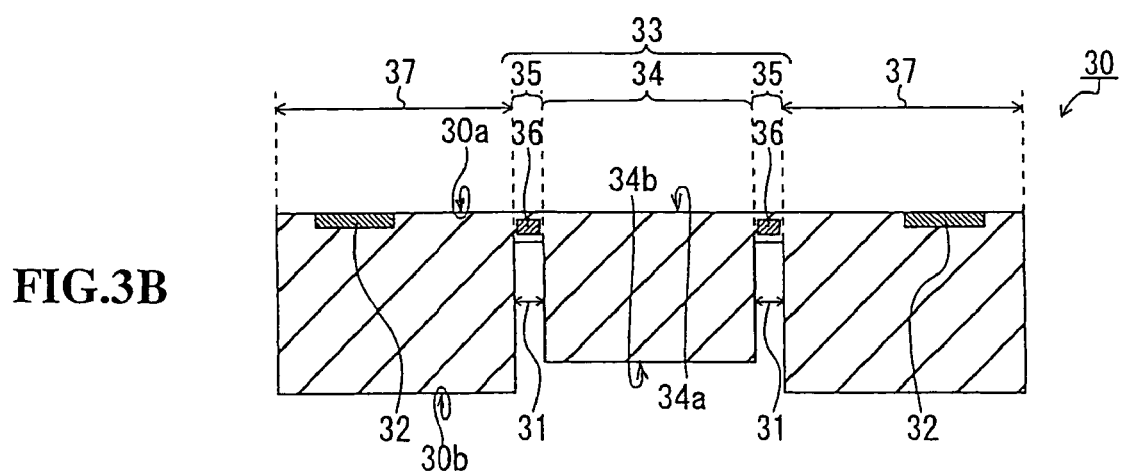
FIG. 3B is a cross-sectional view taken along the dashed line 3B-3B in FIG. 3A.

FIG. 3A is a plan view depicting the acceleration sensor chip viewed from the top, and FIG. 3B is the cross-sectional view taken along the dashed line 3B-3B in FIG. 3A.

The acceleration sensor chip 30 has an upper surface 30a and a lower surface 30b. The upper surface 30a extends in parallel to the lower surface 30b.

The acceleration sensor chip 30 includes the frame 37. The frame 37 is a square frame element which defines an external shape (contour) of the acceleration sensor chip 30.

An opening 31 is formed in the acceleration sensor chip 30. The opening 31 extends inside the frame 37. In this embodiment, the opening 31 is a through hole extending from the upper surface 30a to the lower surface 30b. The opening 31 is surrounded by the frame 37.

The acceleration sensor chip 30 has a movable structure 33. The movable structure 33 has a movable section (weight section) 34 and four beam sections 35.

The movable section 34 is integrated with the beam sections 35 and moves together with the beam sections 35. The movable section 34 has a top face 34a and a bottom face 34b. The top face 34a is planar to the upper surface 30a of the sensor chip 30, and the bottom face 34b is higher than the lower face 30b of the sensor chip 30. In other words, the thickness of the movable section 34 is smaller than the thickness of the frame 37 so as to allow the movable section to move in a certain stroke which is necessary for measurement of the acceleration.

The beam sections 35 extend into the opening 31 from the frame 37. The beam sections 35 are thin in thickness and narrow in width. The beam sections 35 bend when the movable section 34 moves.

The moving section 34 is supported by the ends of the beam sections 35, which project into the opening 31. The movable section 34 is suspended inside the opening 31 by the beam sections 35.

The movable section 34 must be able to move for the measurement of acceleration. To prevent direct contact of the movable section 34 with the frame 37, and to ensure appropriate movement of the movable section 34 supported by the beam sections 35, the moving section 34 is spaced from the frame 37, and the side edges of the beam sections 35 are spaced from the moving section 34.

In this embodiment, the moving structure 33 is a three-axis acceleration sensor, which includes the four beam sections 35, and the moving section 34 supported from four directions by the four beam sections 35. It should be noted that the configuration of the acceleration sensor chip, which can be used in the semiconductor device, is not limited to the above-described configuration, and the present invention can be applied to any suitable moving structure configurations of conventional acceleration sensors. For example, an acceleration sensor chip of cantilever type, which supports the moving section 34 from only one direction, can be employed.

As FIG. 3B shows, detection elements 36 are attached to the beam sections 35. These detection elements 36 are piezo resistance elements in this embodiment.

An appropriate number of detection elements 36, which is decided by the design that can measure the acceleration in a desired precision, are disposed at appropriate positions of the beams 35. These detection elements 36 detect the dislocation (acceleration) of the moving structure 33.

It should be noted that the detection element 36 is not limited to the piezo resistance element. For example, any suitable detection element such as an electrical capacitance-type detection element can be used for the acceleration sensor.

A wire for sending signals from the detection element 36 to the outside or for receiving signals to the detection element 36 is connected (not illustrated) to each detection element 36. A common wire structure can be used for this wire.

A plurality of first electrode pads 32 are disposed on the frame 37 positioned outside the opening 31. The first electrode pads 32 are exposed from the frame 37. The first electrode pads 32 are arrayed along the outer edges of the frame 37. In this embodiment, three first electrode pads 32 are provided for each edge of the frame 37.

The first electrode pads 32 are electronically connected with the detection elements 36 of the beam sections 35 via wires, which are not illustrated.

Modifications

Now a modification to the above described embodiment of the semiconductor device 10 will be described with reference to FIG. 2B.

In this modification, the chip mounting cavity 29 is formed in the chip mounting area 23a of the chip mounting section 23, and the first semiconductor chip 30 is mounted in this chip mounting cavity 29. A configuration other than the chip mounting cavity 29 is completely the same as the semiconductor device 10 shown in FIG. 2A. Therefore the same configuration is denoted with the same reference numerals, of which detailed description is omitted. FIG. 2B is a cross-sectional view similar to FIG. 2A.

Figure 2B:
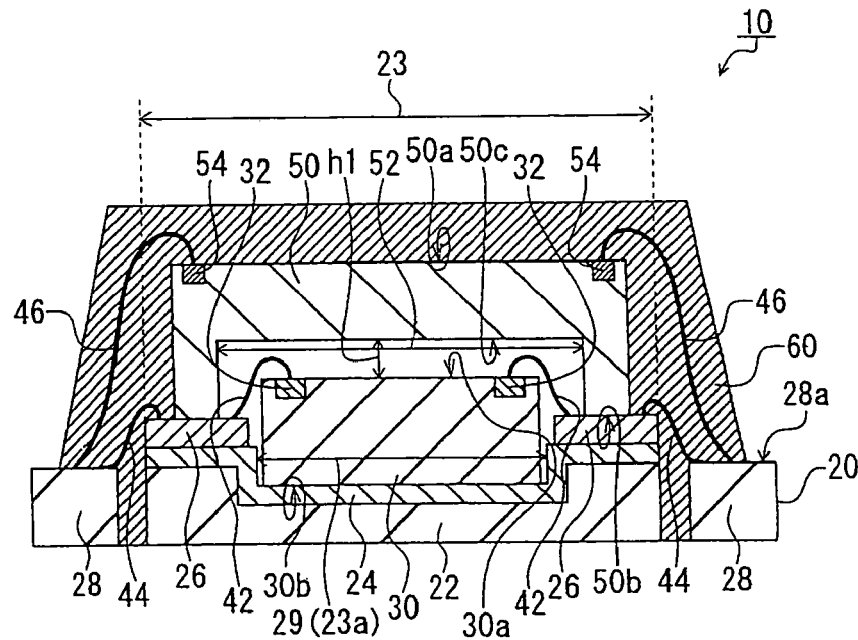
FIG. 2B is a diagram similar to FIG. 2A, depicting a modification to the first embodiment.

In FIG. 2B, the chip mounting section 23 includes the base section 22, which is an essential part of the lead frame 20. The base section 22 is made from conductive metals, such as copper, iron, or their alloy. The copper, iron or their alloy is a material of the lead frame 20. The base section 22 in this modification has a square shape. The chip mounting cavity 29 is provided on the base section 22, which is the chip mounting area 23a. The shape and size of the chip mounting cavity 29 should be sufficient to receive the first semiconductor chip 30, and the depth of the chip mounting cavity 29 is as deep as possible.

The chip mounting cavity 29 can be formed by a common photolithography process and etching process (e.g., so called half-etching process) depending upon the material of the lead frame 20.

The chip mounting section 23 includes an insulation film 24 which covers the surface of the base section 22. The insulation film 24 may be disposed in the chip mounting cavity 29 to cover all or a part of the surface of the chip mounting cavity 29. Alternatively, the insulation film 24 may not be disposed inside the chip mounting cavity 29. In other words, the insulation film 24 may be disposed on the surface of the base section 22, excluding the chip mounting cavity 29.

On the insulation film 24 outside the chip mounting cavity 29 (i.e., outside the chip mounting area 23a), a plurality of inter-connect sections 26 are disposed. The inter-connect sections 26 are provided along the four edges of the base section 22.

From each of the four corners of the chip mounting section 23, a support lead 27 (see FIGS. 1A, 1B and 1C) extends outwards diagonally in a direction equally dividing the corner.

In this modification, the first semiconductor chip 30 is mounted on the insulation film 24 in the chip mounting cavity 29. The first semiconductor chip 30 is mounted by bonding the lower face 30b, preferably using a common insulating die bonding material.

The first semiconductor chip 30 and the first bonding wires 42 are situated in the cavity 52 of the second semiconductor chip 50. The second semiconductor chip 50 is mounted on the chip mounting section 23.

The bottom face 50c of the cavity 52 is spaced from the upper face 30a of the first semiconductor chip 30 by a distance h1 with which the operation of the first semiconductor chip 30 is not affected, just like the first embodiment (FIG. 2A).

In this modification, the thickness of the second semiconductor chip 50 is reduced, and the first semiconductor chip 30 is housed in the second semiconductor chip 50. Also the thickness of the semiconductor device 10 can be decreased for the depth of the chip mounting cavity 29. In other words, the thickness of the semiconductor device 10 can be further decreased without deteriorating the functions of the semiconductor device 10.

When the semiconductor device 10 of FIG. 2B is manufactured, the first semiconductor chip 30 is placed in the chip mounting cavity 29 and mounted there, so that the first semiconductor chip 30 can be positioned on the chip mounting area 23a more easily without requiring subtle alignment.

Here the operation of the semiconductor device 10 will be briefly described.

In the following description, the first semiconductor chip 30 is the acceleration sensor chip 30. For example, it is assumed that the acceleration sensor chip 30 detects the generation of acceleration. At this time, the first signal generated by the acceleration sensor chip 30 is sent to the second electrode pads 54 of the second semiconductor chip 50, which is a control chip, via the first electrode pads 32, first bonding wires 42, inter-connect sections 26, second bonding wires 44, leads 28 and third bonding wires 46. Based on the first signal, the control chip 50 generates the second signal and supplies the second signal to the external environment, which is the substrate for example, via the second electrode pads 54, third bonding wires 46, and exposed section 28a of the leads 28, which are external terminals.

In this way, signals can be exchanged between the first semiconductor chip 30 and the second semiconductor chip 50 because the first semiconductor chip 30 is electrically connected to the second semiconductor chip 50.

Manufacturing Method

An example of the manufacturing method for the semiconductor device 10 will be described with reference to FIGS. 4A, 4B, 5A, 5B, 6A, 6B, 7A and 7B. The manufacturing steps of the semiconductor device of the present invention can be common manufacturing steps using common materials. Therefore a detailed description on materials and conditions of each manufacturing step may be omitted.

Figure 4A:
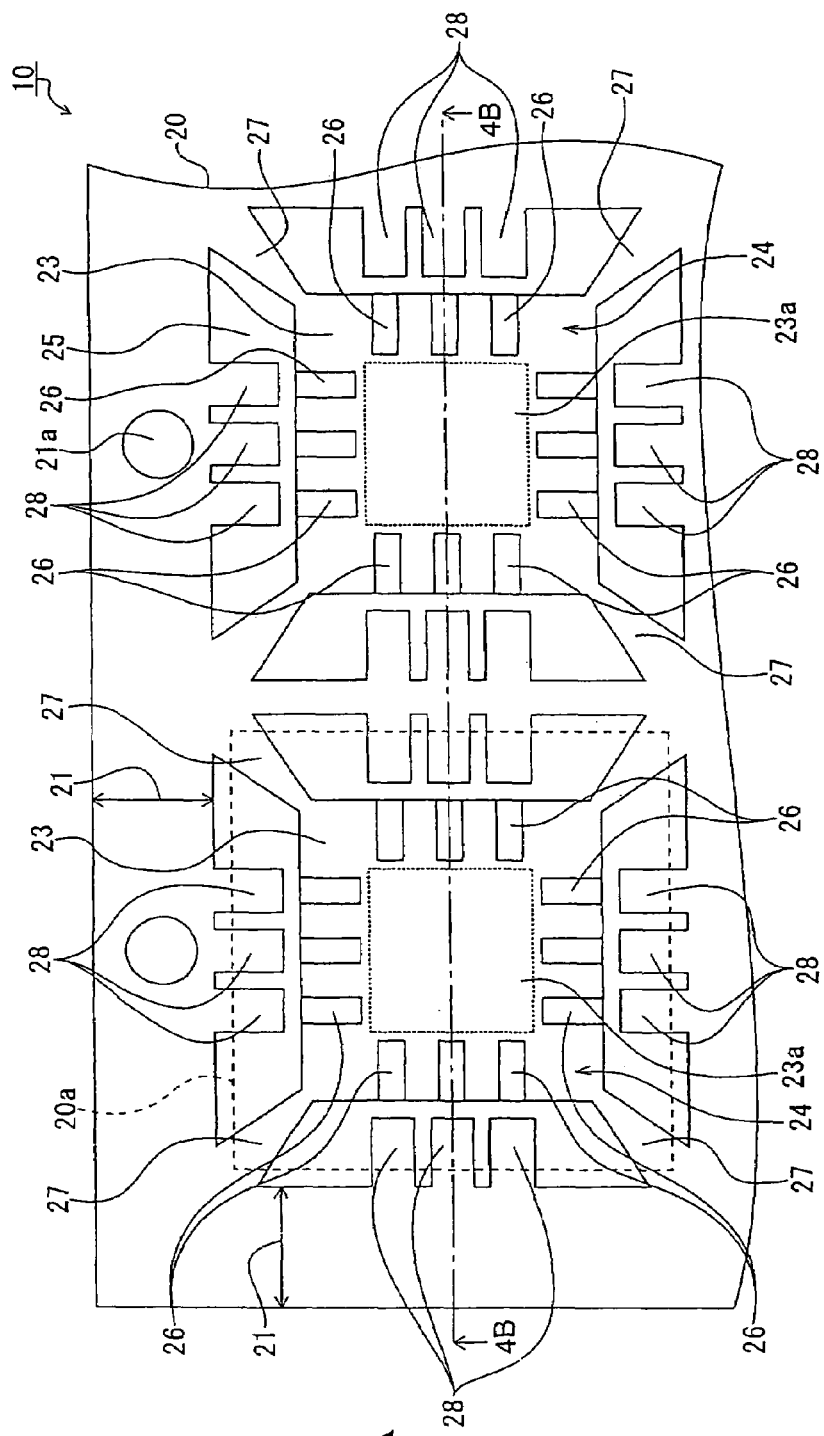
FIG. 4A is a partial plan view of semiconductor devices during a manufacturing process.
Figure 4B:
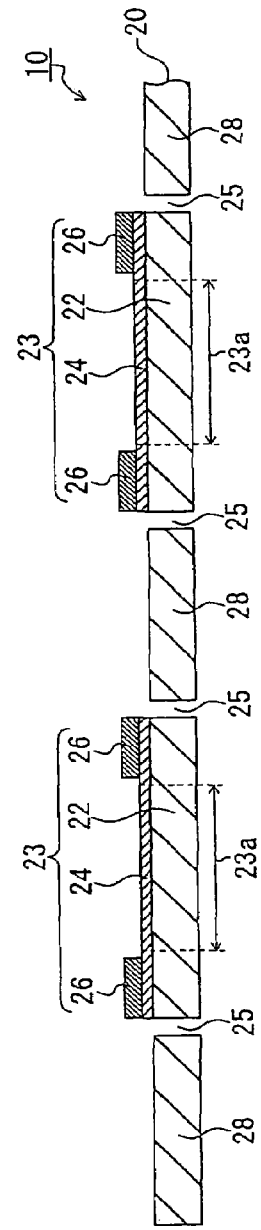
FIG. 4B is a cross-sectional view taken along the dashed line 4B-4B in FIG. 4A, and particularly illustrates the acceleration sensor chip package during the manufacturing process.

FIG. 4A is a partial plan view of the semiconductor device (acceleration sensor chip package) during manufacture, and FIG. 4B is a cross-sectional view taken along the dashed line 4B-4B in FIG. 4A.

Figures 5A, 5B:
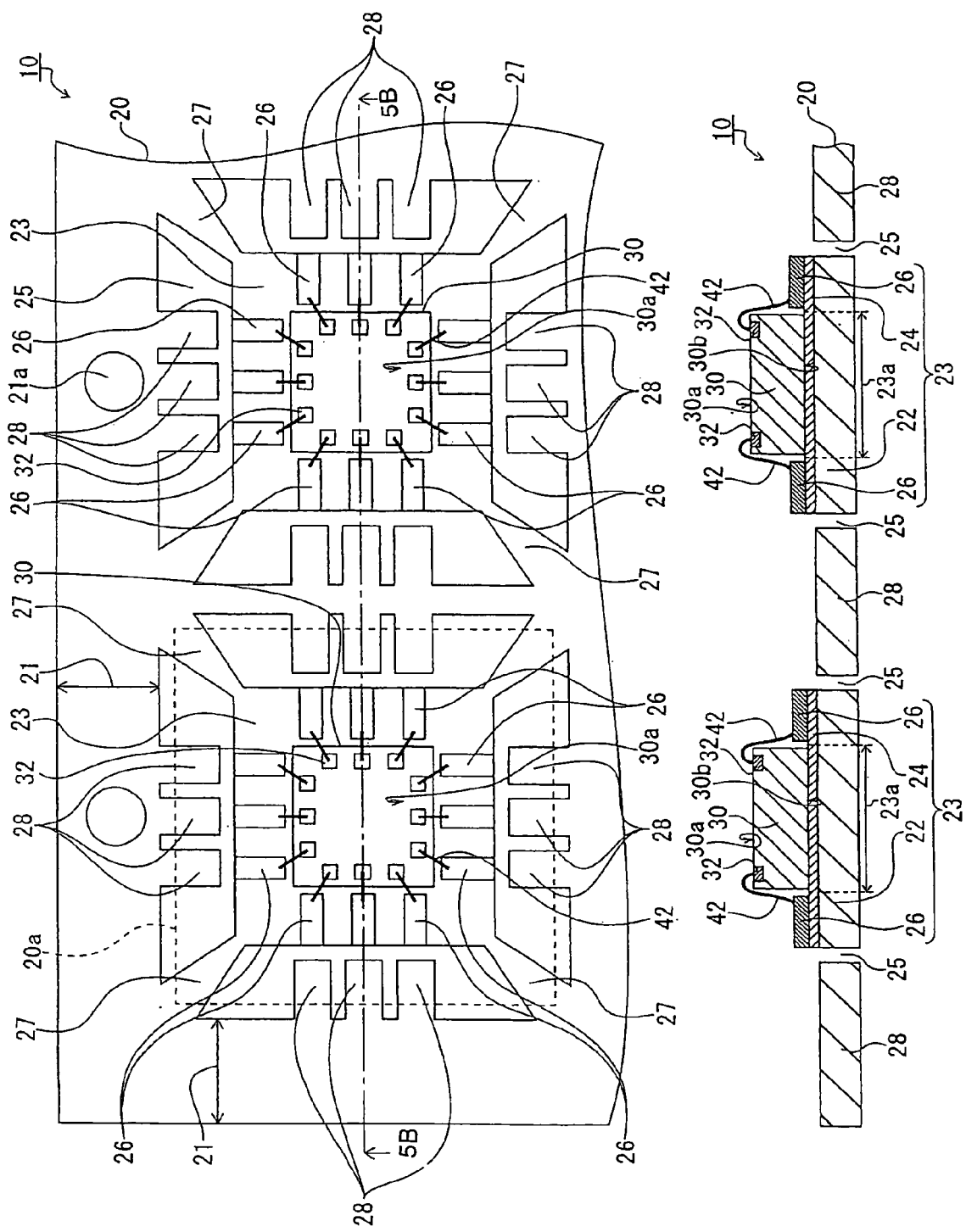
FIGS. 5A and 5B are similar to FIGS. 4A and 4B respectively, showing the manufacturing process at a later stage.
Figures 6A, 6B:
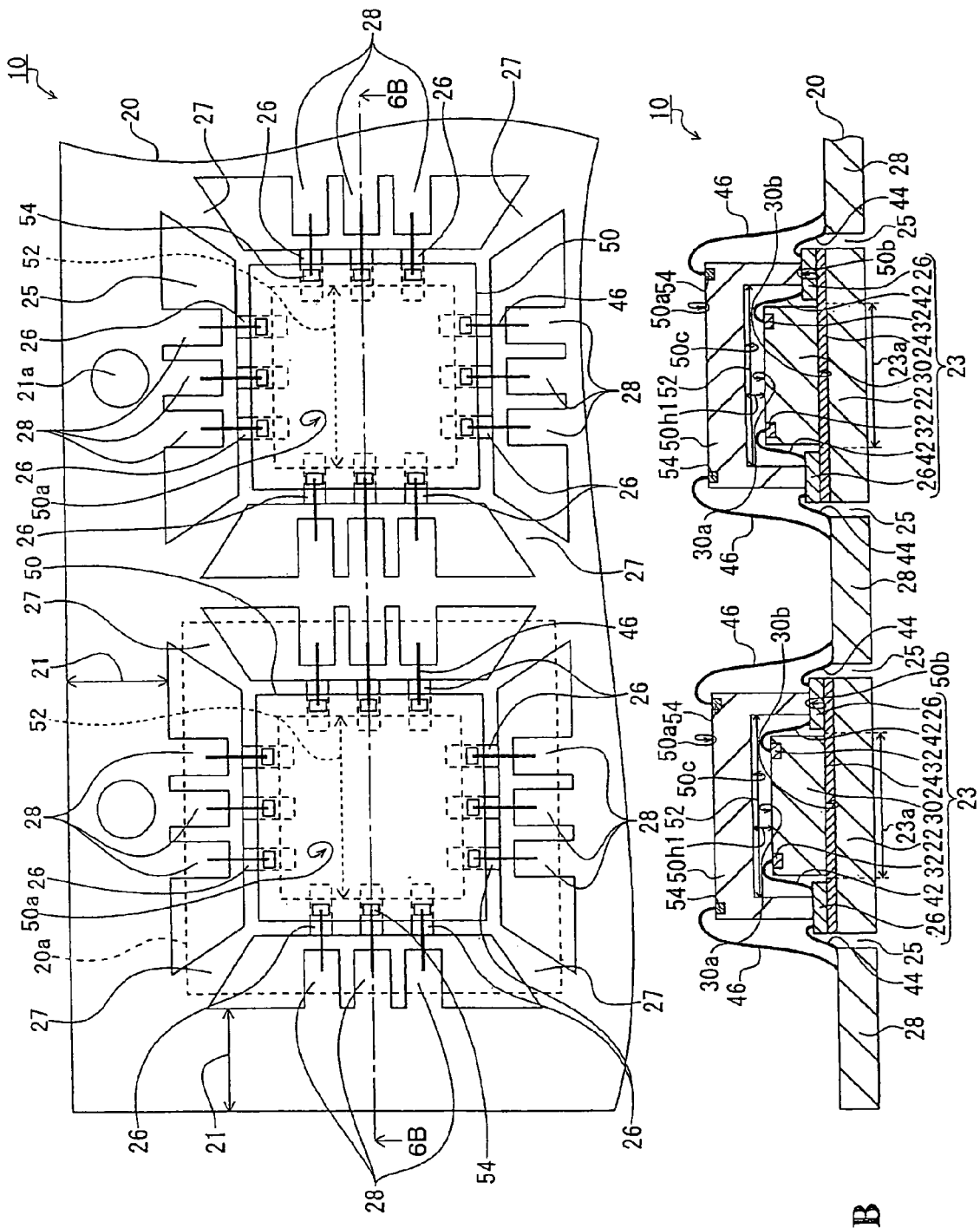
FIGS. 6A and 6B are similar to FIGS. 5A and 5B respectively, showing the manufacturing process at a later stage.
Figures 7A, 7B:
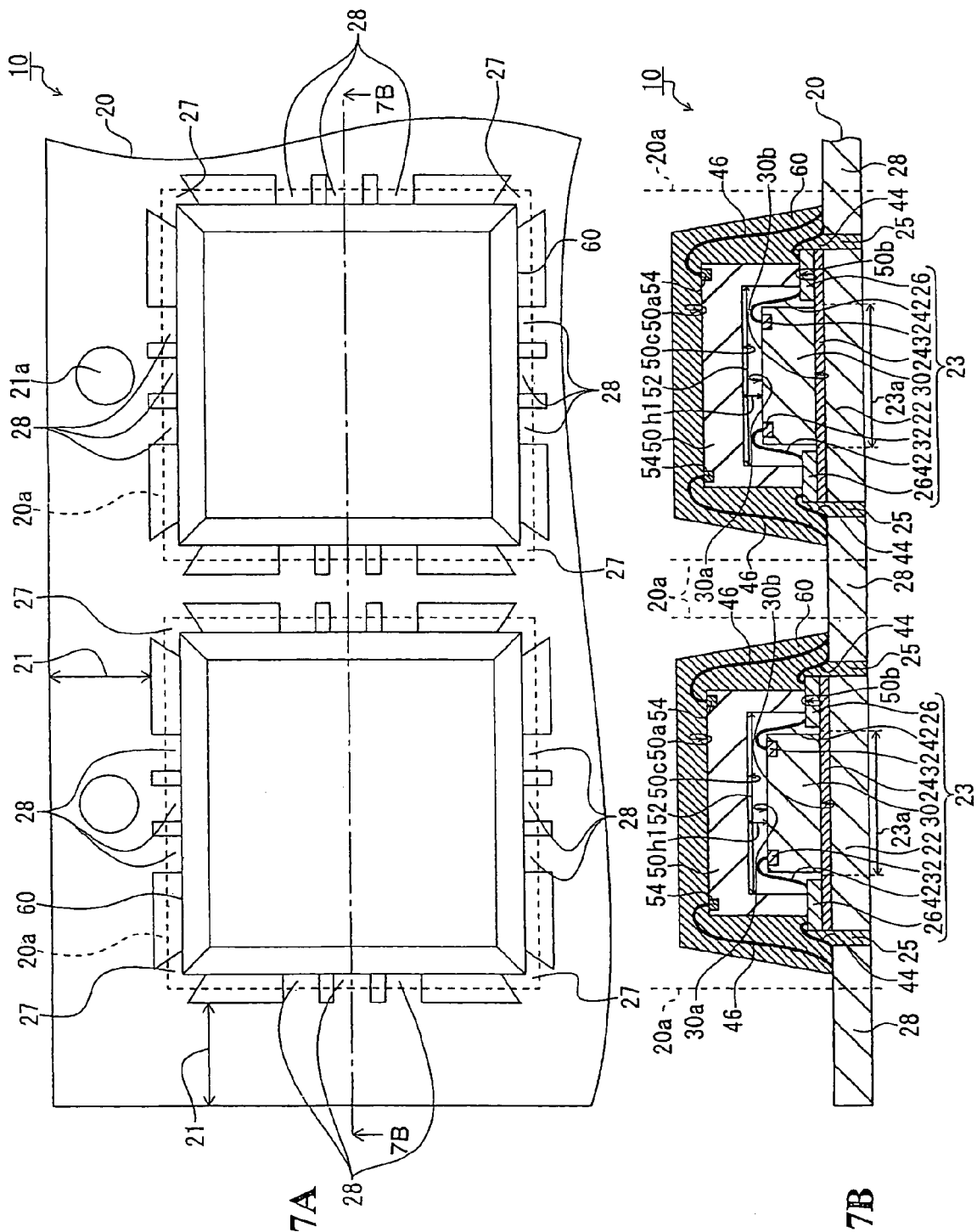
FIGS. 7A and 7B are similar to FIGS. 6A and 6B respectively, showing the manufacturing process at a later stage.

FIGS. 5A and 5B are diagrams of the manufacturing step after FIGS. 4A and 4B. FIGS. 6A and 6B are diagrams of the manufacturing step after FIGS. 5A and 5B. FIGS. 7A and 7B are diagrams of the manufacturing step after FIGS. 6A and 6B.

Referring to FIGS. 4A and 4B, the lead frame 20 is prepared first. The lead frame 20 is made from any appropriate conductive metal, such as copper or a copper alloy. The lead frame 20 includes a main frame 21, base section 22, support lead 27 and a plurality of leads 28, which are integrated on a thin metal plate.

The frame section 21 has a linear shape surrounding one row of a plurality of base sections 22, or has a matrix shape surrounding a plurality of rows and a plurality of columns of base sections 22. The base sections 22 are arranged at equal intervals.

At the outermost side of the frame section 21, one or more sprocket holes 21a, used when transporting the lead frame 20, may be provided if desired.

The base section 22 becomes the chip mounting section (23), including the chip mounting area 23a for mounting the semiconductor chip.

Each base section 22 is square in this embodiment. Each edge of the square of the base section 22 is spaced from the frame section 21.

The upper surface area of the base section 22 can have any shape and size according to the specifications of the semiconductor chip to be mounted and according to the specifications of the semiconductor device to be manufactured.

The four support leads 27 extend from the four corners of each square base section 22, respectively, and are connected to the frame section 21. In this embodiment, the support leads 27 are lead (wire) elements.

The support leads 27 support the base sections 22 on the frame section 21, respectively.

Therefore the lead frame 20 has a plurality of gap sections 25, surrounded by the frame section 21, base section 22 and support lead 27. In other words, in this embodiment, one gap 25 exists for each edge of the square base section 22 such that the four gaps 25 surround the base section 22.

A plurality of leads 28 extend from the frame section 21 into the gaps 25. Each lead 28 extends in a direction perpendicular to the associated edge of the square base section 22. The leads 28 are separated from the base section 22. In this embodiment, three leads 28 are disposed for each gap 25.

In this embodiment, the leads 28 also function as external terminals. Therefore the number of the leads 28 and the spacing between the leads 28 match the number and the spacing of the external terminals of the semiconductor device to be manufactured according to the specifications of the semiconductor chip to be mounted on the base section 22.

In the above-described modified-embodiment, the chip mounting cavity 29 is formed on the base section 22, which is the chip mounting area 23a.

The insulation film 24 is disposed on the base section 22 to cover the surface of the base section 22.

The insulation film 24 can be formed when a lead frame 20 is formed. The insulation film 24 is made from an insulating material, such as polyimide, preferably by an ordinary mask formation process and material coating process.

A plurality of inter-connect sections 26 are provided on the insulation film 24. The inter-connect sections 26 are disposed at the four edges of the square base section 22. Specifically each inter-connect section extends in a direction perpendicular to the associated edge of the base section 22. Each inter-connection section has a short strip shape.

The base section 22 (including the chip mounting cavity 29, which serves as the chip mounting area 23a), insulation film 24 and inter-connect sections 26 are collectively called the "chip mounting section 23". The semiconductor chip is mounted on the chip mounting section 23.

The area 20a surrounded by the dotted line, including the chip mounting section 23 and the surrounding leads 28, is called the "semiconductor area 20a". The semiconductor area 20a is an area separated as an individual semiconductor device 10. The dotted line 20a is used as the dicing line in the die separation process.

In the foregoing description of the lead frame 20, the term "connection" or "connected" is used to describe the positional relationship between the elements.

Generally a plurality of semiconductor areas 20a are formed in a single conductive metal plate (i.e., lead frame 20) by punching processing or by etching the conductive metal plate. Therefore in the lead frame 20, the chip mounting section 23 and the support leads 27 and the leads 28 connected to the chip mounting section 23 are integratedly formed as a continuous pattern.

The above described configuration of the lead frame 20 is a preferred example, and the present invention is not limited to the illustrated configuration as long as the object of the present invention is not affected. For example, the leads 28 may be formed in a bent pattern such that the leads 28 do not contact each other. The connection positions of the support leads 27 and the number of the support leads 27 are not limited to the above-described example, and any appropriate connection position and number can be used.

As FIGS. 5A and 5B show, the first semiconductor chip 30 is mounted on the chip mounting area 23a of the chip mounting section 23. The first semiconductor chip 30 has a plurality of first electrode pads 32 exposed from the upper surface 30a, as described earlier.

The first semiconductor chip 30 is mounted on the insulation film 24 inside the inter-connect sections 26 of the chip mounting section 23.

The lower surface 30b of the first semiconductor chip 30 is adhered onto the insulation film 24 using a common die bonding material so that the first semiconductor chip is mounted on the insulation film 24.

The above described modification of the semiconductor device 10 has the base section 22. The first semiconductor chip 30 is mounted in the chip mounting cavity 29. If there is no insulation film 24 in the chip mounting cavity 29, it is preferable to mount the first semiconductor chip 30 using an insulating die bonding material.

If the insulation film 24 is formed in the chip mounting cavity 29, the semiconductor chip 30 is mounted on the insulation film 24 inside the chip mounting cavity 29.

The chip mounting cavity 29 is formed in the chip mounting section 23, so that alignment, when the first semiconductor chip 30 is mounted, is easier. Therefore the mounting step of the first semiconductor chip 30 becomes easier and becomes more accurate, and an improvement in yield can be expected.

Then the first electrode pads 32 and the inter-connect sections 26 are wire-bonded using the first bonding wires 42.

This wire bonding step is performed by any appropriate method, such as thermo-compression and ultrasonic thermo-compression, using common bonding wires and a bonding device.

In this embodiment, one first bonding wire 42 connects one electrode pad 32 with one inter-connect section 26 in a one-to-one correspondence at the shortest distance. The bonding position of the inter-connect section 26 is preferably close to the first semiconductor chip 30 if the mounting of the second semiconductor chip is considered.

After that, the second semiconductor chip 50 is prepared. As described above, the second semiconductor chip 50 has the first main surface 50a and the opposite, second main surface 50b.

The second semiconductor chip 50 has a cavity 52. The cavity 52 has a bottom face 50c between the first and second main surfaces 50a and 50b.

The second semiconductor chip 50 has a plurality of second electrode pads 54 disposed along the edges of the first main surface 50a. The second electrode pads 54 are exposed from the first main surface 50a.

Then as FIGS. 6A and 6B show, the second semiconductor chip 50 is mounted on the chip mounting section 23 outside the chip mounting area 23a such that the first semiconductor chip 30 and the first bonding wires 42 are received in the cavity 52.

The second main surface 50b of the second semiconductor chip 50 contacts the chip mounting section 23 and the second semiconductor chip 50 spans the inter-connect sections 26 as shown in FIG. 6B. The leg portions of the second semiconductor chip 50 extend in a direction perpendicular to the lead frame 20 (or the horizontal plane). Because the second semiconductor chip 50 spans the inter-connect sections 26, the mounting step is executed using an insulating die bonding material.

Specifically the second main surface 50b is bonded to the chip mounting section 23 using a common insulting die bonding material, such that a partial area of the inter-connect sections 26, to which the first bonding wires 42 are connected, is received in the cavity 52, and a part of the remaining area of the inter-connect sections 26 is exposed from the second semiconductor chip 50 to the outside.

Then the exposed part of the inter-connect sections 26 (exposed from the second semiconductor chip 50) are electrically connected to the leads 28 by the second bonding wires 44 with wire bonding.

Likewise, the second electrode pads 54 and the leads 28 are electrically connected by the third bonding wires 46.

The wire bonding process using the second and third bonding wires 44 and 46 can be performed in the same way as the wire bonding process applied to the first bonding wires 42.

Subsequently, as FIGS. 7A and 7B show, the sealing section 60 is formed. The sealing section 60 seals the second and third bonding wires 44 and 46 and the second semiconductor chip 50.

The sealing process is performed exposing a part (28a) of the leads 28 outside the sealing section 60. The exposed sections 28a of the leads 28 (see FIG. 1C and FIGS. 2A and 2B) can be used as external terminals.

The sealing process may be a common sealing method which uses a die with any appropriate material, such as a molded resin and liquid resin. In this embodiment, the sealing process is executed using a die which can have a plurality of cavities. Each cavity is associated with each semiconductor area 20a. Each cavity covers the frame section 21 of the lead frame 20, a part of the support leads 27 existing outside the semiconductor area 20a, and a part of the leads 28 positioned outside the semiconductor area 20a.

The sealing resin material is filled and hardened in the cavities, and then the die is removed, so that a plurality of semiconductor devices, fixed in the lead frame 20 by the support leads 27, are created.

Finally the semiconductor areas 20a are diced respectively. Specifically, the leads 28 and the support leads 27, exposed from the sealing section 60, are cut to have separate semiconductor devices 10.

The leads 28 and the support leads 27 are cut using a common punching processing or a high-speed rotary blade of a common dicing device.

In this way a plurality of semiconductor devices 10 can be efficiently acquired from a single lead frame 20 by simple steps.

This application is based on a Japanese Patent Application No. 2004-369876 filed on Dec. 21, 2004 and the entire disclosure thereof is incorporated herein by reference.

What is claimed is:

1. A semiconductor device comprising:
a lead frame including a chip mounting section and a plurality of leads, the chip mounting section having a base section, an insulation film, a plurality of inter-connect section, and a chip mounting area, the base section having a surface and a plurality of edges, the insulation film covering the surface of said base section, the plurality of inter-connect sections being arrayed on said insulation film along the plurality of edges of said base section, the chip mounting area being disposed inside the array of said plurality of inter-connect sections, and the plurality of leads being spaced from said chip mounting section to surround said chip mounting section;
a first semiconductor chip having a plurality of first electrode pads mounted on said chip mounting area of said lead frame;
first bonding wires for electrically connecting said first electrode pads to said inter-connect sections;
a second semiconductor chip having a cavity, a plurality of second electrode pads, a first main surface and a second main surface opposite said first main surface, the second semiconductor chip being mounted on said chip mounting section with a part of said plurality of inter-connect sections exposed, the cavity being formed from said second main surface, the plurality of second electrode pads being exposed from said first main surface and being formed along edges of said first main surface, and said first semiconductor chip and said first bonding wires being received in said cavity;
second bonding wires for electrically connecting said exposed part of said inter-connect sections to said leads;
third bonding wires for electrically connecting said second electrode pads to said leads; and
a sealing section for sealing said second and third bonding wires, said second semiconductor chip, and said leads, with a part of said leads left as an exposed section, and using the exposed section of said leads as external terminals.

2. The semiconductor device according to claim 1, wherein the base section of said chip mounting section further includes a mounting cavity for mounting said first semiconductor chip in said chip mounting area, and said first semiconductor chip is received in said mounting cavity.

3. The semiconductor device according to claim 1, wherein said first semiconductor chip is an MEMS chip having a moving structure, the moving structure has a moving section, said first electrode pad is an electrode pad for receiving a signal generated upon a movement of said moving structure or for supplying a signal to said moving structure, and said second semiconductor chip is a control chip for controlling said MEMS chip.

4. The semiconductor device according to claim 3, wherein said first semiconductor chip is an acceleration sensor chip having the moving structure and a detection element, the moving structure further has a frame section and a beam section, the frame section has a front surface and a back surface and surrounds an opening extending from said front face to said back surface, the beam section extends from said frame section into said opening, the moving section is received in said opening and is movably supported by said beam section, and the detection element detects a displacement of said moving structure, and
said first electrode pad is electrically connected with said detection element and is disposed in said frame section.

5. The semiconductor device according to claim 4, wherein a height of said moving section is smaller than a height of the frame section.

6. The semiconductor device according to claim 4, wherein the beam section has a plurality of beams extending in a plurality of directions toward the moving section to support the moving section.

7. The semiconductor device according to claim 4, wherein the beam section has a single beam to support the moving section.

8. A manufacturing method for a semiconductor device, comprising the steps of:
providing a lead frame having a chip mounting section and a plurality of leads, the chip mounting section having a base section, an insulation film, a plurality of inter-connect sections and a chip mounting area, the insulation film covering a surface of said base section, the plurality of inter-connect sections being arrayed on said insulation film along edges of said base section, the chip mounting area being disposed inside the array of said plurality of inter-connect sections, and the plurality of leads being spaced away from said chip mounting section to surround said chip mounting section;
mounting a first semiconductor chip having a plurality of first electrode pads on said chip mounting area;
electrically connecting said first electrode pads to said inter-connect sections by first bonding wires;
providing a second semiconductor chip having a cavity, a plurality of second electrode pads, a first main surface and a second main surface opposite said first main surface, the cavity being formed from said second main surface, and the plurality of second electrode pads being exposed from said first main surface and being formed along edges of said first main surface;
mounting said second semiconductor chip on said chip mounting section, such that said first semiconductor chip and said first bonding wires are received in said cavity and a part of said plurality of inter-connect sections is exposed;
electrically connecting said exposed part of the inter-connect sections to said leads by second bonding wires;
electrically connecting said second electrode pads to said leads by third bonding wires;
forming a sealing section to seal said second and third bonding wires, said second semiconductor chip and said leads, with a part of said leads left as an exposed section; and
cutting said exposed section of the leads to obtain an independent semiconductor device.

9. The manufacturing method for a semiconductor device according to claim 8, wherein the step of mounting said first semiconductor chip on said chip mounting section includes mounting said first semiconductor chip in a mounting cavity which said chip mounting area has in said base section.

10. The manufacturing method for a semiconductor device according to claim 8, wherein the step of mounting said first semiconductor chip on said chip mounting area includes mounting an MEMS chip having a moving structure on said chip mounting area such that said first electrode pad serves as an electrode pad for receiving a signal generated upon a movement of said moving structure or for supplying a signal to said moving structure, and
the step of mounting said second semiconductor chip on said chip mounting section includes mounting said second semiconductor chip, which is a control chip for controlling said MEMS chip, on said chip mounting section.

11. The manufacturing method for a semiconductor device according to claim 8, wherein
   said step of mounting said first semiconductor chip on said chip mounting area includes mounting an acceleration sensor chip on said chip mounting area, the acceleration sensor including a moving structure and a detection element, the moving structure having a frame section, a beam section and a moving section, the frame section having a front surface and a back surface opposite said front surface and surrounding an opening extending from said front surface to said back surface, the beam section extending from said frame section into said opening, the moving section being received in said opening and movably supported by said beam section, and the detection element detecting a displacement of said moving structure, and
   the step of mounting said second semiconductor chip on said chip mounting section includes mounting said second semiconductor chip, which is a control chip for controlling said acceleration sensor chip, on said chip mounting section.

12. The manufacturing method for a semiconductor device according to claim 8, wherein the step of electrically connecting said first electrode pads to said inter-connect sections is performed by thermo-compression or ultrasonic thermo-compression process.

13. The manufacturing method for a semiconductor device according to claim 8, wherein the step of electrically connecting said exposed part of the inter-connect sections to said leads is performed by thermo-compression or ultrasonic thermo-compression process.

14. The manufacturing method for a semiconductor device according to claim 8, wherein the step of electrically connecting said second electrode pads to said leads is performed by thermo-compression or ultrasonic thermo-compression process.

15. A semiconductor device comprising:
   lead frame means including chip mounting means and lead means, the chip mounting means having a base, insulation means, inter-connect means, and a chip mounting area, the base having a surface and a plurality of edges, the insulation means covering the surface of said base, the inter-connect means being arrayed on said insulation means along the plurality of edges of said base, the chip mounting area being disposed inside the array of said inter-connect means, and the lead means being spaced from said chip mounting means to surround said chip mounting means;
   first semiconductor chip means having a plurality of first electrode pad means mounted on said chip mounting area of said lead frame means;
   first bonding wire means for electrically connecting said first electrode pad means to said inter-connect means;
   second semiconductor chip means having a cavity and a plurality of second electrode pad means, the second semiconductor chip means being mounted on said chip mounting means with a part of said inter-connect means exposed, the cavity being formed from a lower surface of the second semiconductor chip means, the plurality of second electrode pad means being exposed from an upper surface of the second semiconductor chip means and being formed along edges of said upper surface of the second semiconductor chip means, and said first semiconductor chip means and said first bonding wire means being received in said cavity;
   second bonding wire means for electrically connecting said exposed part of said inter-connect means to said lead means;
   third bonding wire means for electrically connecting said second electrode pad means to said lead means; and
   sealing means for sealing said second and third bonding wire means, said second semiconductor chip mean, and said lead means, with a part of said lead means left as an exposed section, and using the exposed section of said lead means as external terminals.

16. The semiconductor device according to claim 15, wherein the base of said chip mounting means further includes a mounting cavity for mounting said first semiconductor chip means in said chip mounting area, and said first semiconductor chip means is received in said mounting cavity.

17. The semiconductor device according to claim 15, wherein said first semiconductor chip means is an MEMS chip having moving means, the moving means has a moving section, said first electrode pad means is an electrode pad for receiving a signal generated upon a movement of said moving section or for supplying a signal to said moving section, and said second semiconductor chip means is a control chip for controlling said MEMS chip.

18. The semiconductor device according to claim 17, wherein said first semiconductor chip means is an acceleration sensor chip having the moving means and detection means, the moving means further has a frame section and a beam section, the frame section has a front surface and a back surface and surrounds an opening extending from said front face to said back surface, the beam section extends from said frame section into said opening, the moving section is received in said opening and is movably supported by said beam section, and the detection means detects a displacement of said moving section, and
   said first electrode pad means is electrically connected with said detection means and is disposed in said frame section.

19. The semiconductor device according to claim 18, wherein a height of said moving section is smaller than a height of the frame section.

20. The semiconductor device according to claim 18, wherein the beam section has a plurality of beams extending in a plurality of directions toward the moving section to support the moving section.

\* \* \* \* \*